(12) United States Patent
Kim

(10) Patent No.: US 9,570,018 B2
(45) Date of Patent: Feb. 14, 2017

(54) BACKLIGHT DRIVER OF LIQUID CRYSTAL DISPLAY DEVICE AND METHOD FOR DRIVING THE SAME TO MAINTAIN STABILITY OF THE DUTY RATIO OF THE PWM SIGNAL DRIVING THE BACKLIGHT

(71) Applicant: LG Display Co., Ltd., Seoul (KR)

(72) Inventor: Min-Kyu Kim, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 361 days.

(21) Appl. No.: 13/903,725

(22) Filed: May 28, 2013

(65) Prior Publication Data

US 2013/0321254 A1 Dec. 5, 2013

(30) Foreign Application Priority Data

May 29, 2012 (KR) .......................... 10-2012-0056839

(51) Int. Cl.
*G09G 3/36* (2006.01)
*G09G 3/20* (2006.01)
(Continued)

(52) U.S. Cl.
CPC .............. *G09G 3/36* (2013.01); *G09G 3/2014* (2013.01); *G09G 3/3406* (2013.01);
(Continued)

(58) Field of Classification Search
CPC ...................... G09G 3/3406; G09G 2320/0247; G09G 2340/0407; G09G 2340/0435
See application file for complete search history.

(56) References Cited

U.S. PATENT DOCUMENTS 7,295,180 B2 * 11/2007 Ichikawa ............... G09G 3/342
  315/308
8,334,834 B2 * 12/2012 Chen .................... G09G 3/3406
  345/102
(Continued)

FOREIGN PATENT DOCUMENTS

CN 101639167 A 2/2010
CN 101714342 A 5/2010
(Continued)

OTHER PUBLICATIONS

Korean Intellectual Property Office, Office Action, Korean Patent Application No. 10-2012-0056839, Mar. 30, 2014, five pages [with concise explanation of relevance in English].
(Continued)

*Primary Examiner* — Chanh Nguyen
*Assistant Examiner* — Yuzhen Shen
(74) *Attorney, Agent, or Firm* — Fenwick & West LLP

(57) ABSTRACT

A backlight driver and a method of driving the same are disclosed, which remove an unstable duty ratio by filtering an input PWM signal so as to prevent backlight flicker although the input PWM signal becomes unstable. The backlight driver includes a duty ratio detector for detecting a duty ratio of an input pulse width modulation (PWM) signal; a duty ratio filter for detecting a difference between a current duty ratio received from the duty ratio detector and a previous duty ratio, determining whether the detected duty ratio difference satisfies a preset reference condition, selecting one of the current duty ratio and the previous duty ratio, and outputting the selected duty ratio; and a PWM generator for generating an output PWM signal obtained when a selected duty ratio from the duty ratio filter is reflected in an input synchronization signal, and outputting the output PWM signal to a backlight unit.

7 Claims, 6 Drawing Sheets

(51) Int. Cl.
*G09G 3/34* (2006.01)
*H03K 7/08* (2006.01)

(52) U.S. Cl.
CPC ... *G09G 3/3648* (2013.01); *G09G 2320/0247* (2013.01); *G09G 2340/0407* (2013.01); *H03K 7/08* (2013.01)

(56) References Cited

U.S. PATENT DOCUMENTS

| | | |
|---|---|---|
| 2007/0057639 A1 | 3/2007 | Sun et al. |
| 2007/0262948 A1* | 11/2007 | Han et al. .................. 345/102 |
| 2008/0042968 A1* | 2/2008 | Oh .............................. 345/102 |
| 2008/0231588 A1* | 9/2008 | Tsai ............................ 345/102 |
| 2011/0032008 A1* | 2/2011 | Zhao ...................... H03K 7/08 327/114 |
| 2011/0074301 A1* | 3/2011 | Goder ................ H05B 33/0818 315/210 |
| 2012/0013265 A1* | 1/2012 | Yang et al. .................. 315/246 |
| 2012/0182333 A1* | 7/2012 | Baba et al. .................. 345/691 |

FOREIGN PATENT DOCUMENTS

| | | |
|---|---|---|
| CN | 102243843 A | 11/2011 |
| CN | 102474244 A | 5/2012 |
| KR | 10-2008-0020729 A | 3/2008 |
| KR | 10-2012-0007428 A | 1/2012 |

OTHER PUBLICATIONS

Korean Intellectual Property Office, Office Action, Korean Patent Application No. 10-2012-0056839, Dec. 30, 2014, six pages [with concise explanation of relevance in English].

State Intellectual Property Office of the People's Republic of China, First Office Action, Chinese Patent Application No. 201310206534.5, Jan. 4, 2015, thirteen pages.

* cited by examiner

BACKLIGHT DRIVER OF LIQUID CRYSTAL DISPLAY DEVICE AND METHOD FOR DRIVING THE SAME TO MAINTAIN STABILITY OF THE DUTY RATIO OF THE PWM SIGNAL DRIVING THE BACKLIGHT

CROSS-REFERENCE TO RELATED APPLICATION

This application claims the benefit of Korean Patent Application No. 10-2012-0056839, filed on May 29, 2012, which is hereby incorporated by reference as if fully set forth herein.

BACKGROUND OF THE INVENTION

Field of the Invention

The present invention relates to a backlight driver of a liquid crystal display device, and more particularly, to a backlight driver of a liquid crystal display device and a method for driving the same so as to prevent backlight flicker by properly filtering an input pulse width modulation (PWM) signal.

Discussion of the Related Art

Representative examples of a flat panel display apparatus for displaying an image using digital data include a liquid crystal display (LCD) device using liquid crystal, a plasma display panel (PDP) using discharge of inert gas, a organic light emitting diode (OLED) display device using an OLED, and the like. Among these, the LCD device has been widely used in various application fields such as in a television (TV), a monitor, a laptop computer, and a portable phone.

An LCD device displays an image through a pixel matrix using the electrical and optical properties of liquid crystals having anisotropic properties with respect to refractive index, dielectric constant, and the like. Each pixel of the LCD device implements a gray level by adjusting optical transmittance with respect to a polarization plate using variation in liquid crystal orientation direction according to a data signal. The LCD device includes a liquid crystal panel for displaying an image through the pixel matrix, a drive circuit for driving the liquid crystal panel, a backlight unit for irradiating light to the liquid crystal panel, and a backlight driver for driving the backlight unit.

The backlight driver for drive of the backlight unit controls the brightness of the backlight unit by adjusting on/off time of the backlight unit according to a duty ratio of a pulse width modulation (PWM) signal input from a TV set or a timing controller.

In this case, the backlight driver detects the duty ratio of the input PWM signal and reflects the detected duty ratio to a vertical synchronization signal input from a timing controller to generate and use an output PWM signal for control of the backlight unit in order to drive the backlight unit according to the liquid crystal panel.

However, since there occurs a specific period in which a duty ratio becomes unstable when a frequency of an input PWM signal is changed, the duty ratio of the output PWM signal is changed, resulting in backlight flicker.

For example, if a frequency of the input PWM signal having the duty ratio of 10% is changed from 60 Hz to 50 Hz as exemplarily shown in FIG. 1, there may occur a specific period having an unstable duty ratio of 8.35% during the frequency change process. In this case, the unstable duty ratio is reflected in the output PWM signal without change so as to change backlight luminance, resulting in the occurrence of image quality deterioration such as flicker on the screen.

SUMMARY OF THE INVENTION

Accordingly, the present invention is directed to a backlight driver of a liquid crystal display device and a method for driving the same that substantially obviate one or more problems due to limitations and disadvantages of the related art.

An object of the present invention is to provide a backlight driver and a method for driving the same that remove an unstable duty ratio by filtering an input PWM signal so as to prevent backlight flicker despite the input PWM signal becoming unstable.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a backlight driver includes a duty ratio detector for detecting a duty ratio of an input pulse width modulation (PWM) signal; a duty ratio filter for detecting a difference between a current duty ratio received from the duty ratio detector and a previous duty ratio, determining whether the detected duty ratio difference satisfies a preset reference condition, selecting one of the current duty ratio and the previous duty ratio, and outputting the selected duty ratio; and a PWM generator for generating an output PWM signal obtained when a selected duty ratio from the duty ratio filter is reflected in an input synchronization signal, and outputting the output PWM signal to a backlight unit.

The duty ratio filter may select/output the current duty ratio when the duty ratio difference satisfies the reference condition, and may select/output the previous duty ratio when the duty ratio difference exceeds the reference condition.

The duty ratio filter may feed back the selected duty ratio, and use the fed back duty ratio as the previous duty ratio.

The duty ratio filter may include: a duty ratio comparator for comparing the previous duty ratio with a current duty ratio so as to detect the duty ratio difference; a duty ratio determination unit for comparing the duty ratio difference from the duty ratio comparator with the reference condition so as to output a flag signal indicating whether the reference condition is satisfied; and an output multiplexer for selecting one of a previous duty ratio from the duty ratio comparator and a current duty ratio in response to the flag signal from the duty ratio determination unit, and outputting the selected duty ratio.

The backlight driver may further include: a buffer for delaying a current duty ratio from the duty ratio detector by one frame, and outputting the delayed result; and an input multiplexer for selecting one of the delayed duty ratio from the buffer and the selected duty ratio from the output multiplexer in response to a flag signal from the duty ratio determination signal, and outputting the selected duty ratio as the previous duty ratio.

If the duty ratio difference is less than a preset minimum reference value or is higher than a preset maximum reference value, the duty ratio determination unit may determine that the current duty ratio is stable; and if the duty ratio difference is equal to or higher than the minimum reference value or is equal to or less than the maximum reference value, the duty ratio determination unit may determine that the current duty ratio is unstable.

If the duty ratio difference is between a minimum reference value and a maximum reference value, the duty ratio determination unit may determine that the current duty ratio is stable; and if the duty ratio difference is not between the minimum reference value and the maximum reference value, the duty ratio determination unit may determine that the current duty ratio is unstable.

The input PWM signal may be a PWM signal received from a host set or a timing controller, and the synchronization signal may be a vertical synchronization signal received from the timing controller.

In another aspect of the present invention, a method for driving a backlight driver includes: detecting a duty ratio of an input pulse width modulation (PWM) signal; detecting a difference between the detected current duty ratio and a previous duty ratio, determining whether the detected duty ratio difference satisfies a preset reference condition, selecting one of the current duty ratio and the previous duty ratio, and outputting the selected duty ratio; and generating an output PWM signal obtained when a selected duty ratio from the duty ratio filter is reflected in an input synchronization signal, and outputting the output PWM signal to a backlight unit.

Selecting the duty ratio may include: selecting/outputting the current duty ratio when the duty ratio difference satisfies the reference condition, and selecting/outputting the previous duty ratio when the duty ratio difference exceeds the reference condition.

The method may further include: feeding back the selected duty ratio, and using the fed back duty ratio as the previous duty ratio.

Selecting the duty ratio may include: detecting the duty ratio difference by comparing the previous duty ratio with a current duty ratio; comparing the duty ratio difference from the duty ratio comparator with the reference condition, and outputting a flag signal indicating whether the reference condition is satisfied; and selecting one of a previous duty ratio from the duty ratio comparator and a current duty ratio in response to the flag signal from the duty ratio determination unit, and outputting the selected duty ratio.

Selecting the duty ratio may include: delaying a current duty ratio from the duty ratio detector by one frame, and outputting the delayed result; feeding back the selected duty ratio, and using it as the previous duty ratio; selecting one of the delayed duty ratio and the fed back duty ratio in response to the flag signal, and outputting the selected duty ratio as the previous duty ratio.

Outputting the flag signal may include: if the duty ratio difference is less than a preset minimum reference value or is higher than a preset maximum reference value, the duty ratio determination unit determines that the current duty ratio is stable; and if the duty ratio difference is equal to or higher than the minimum reference value or is equal to or less than the maximum reference value, the duty ratio determination unit determines that the current duty ratio is unstable.

If the duty ratio difference is between a minimum reference value and a maximum reference value, the duty ratio determination unit may determine that the current duty ratio is stable; and if the duty ratio difference is not between the minimum reference value and the maximum reference value, the duty ratio determination unit may determine that the current duty ratio is unstable.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the exemplary embodiments of the present invention, examples of which are illustrated in the accompanying drawings. Wherever possible, the same reference numbers will be used throughout the drawings to refer to the same or like parts.

Figure 1:
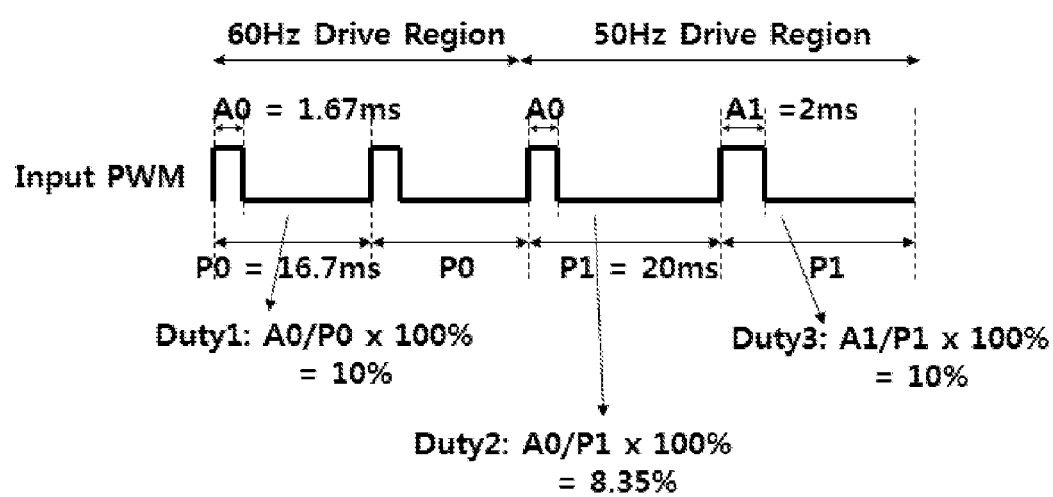
FIG. 1 is a waveform diagram showing a process of the related art in which a frequency of a pulse width modulation (PWM) signal varies.
Figure 2:
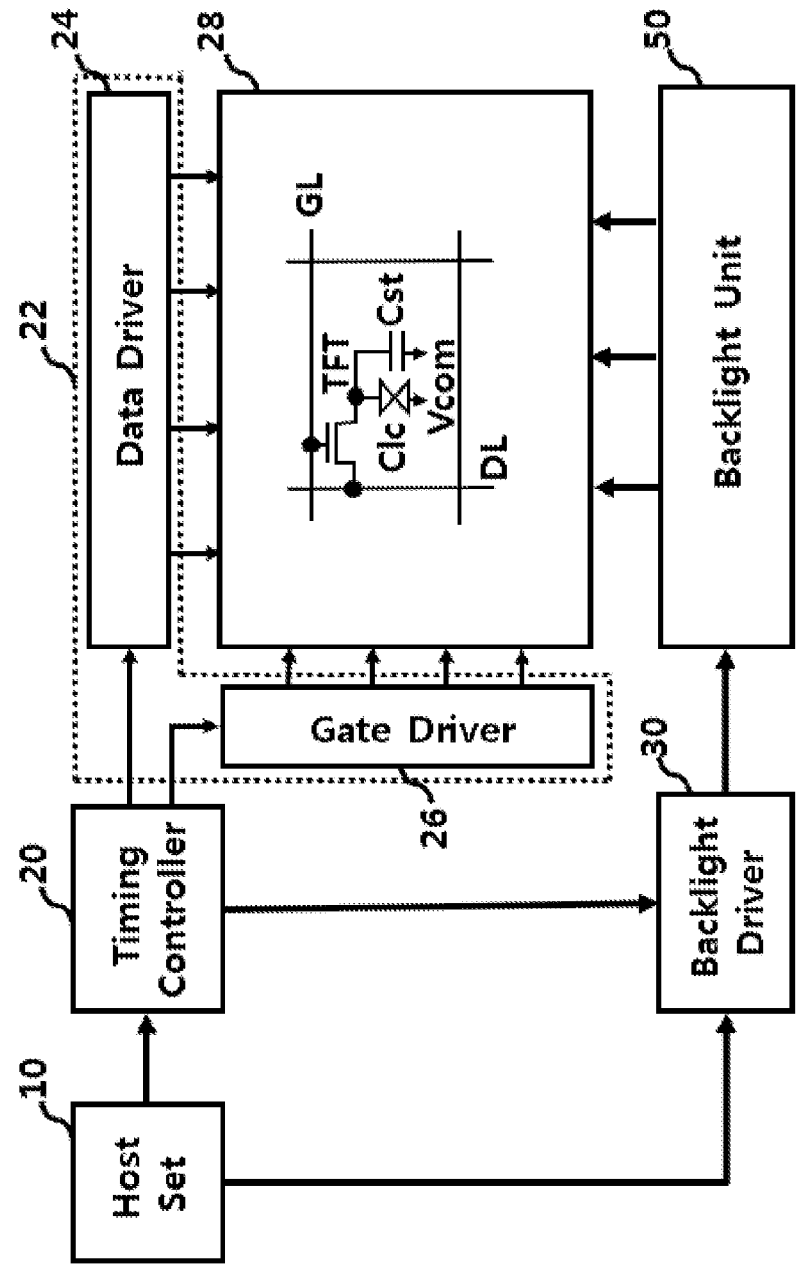
FIG. 2 is a schematic block diagram of a liquid crystal display device including a backlight driver according to an embodiment of the present invention.

FIG. 2 is a schematic block diagram of a liquid crystal display device including a backlight driver according to an embodiment of the present invention.

The liquid crystal display device shown in FIG. 2 includes a liquid crystal panel 28, a backlight unit 50, a panel driver 22 including a data driver 24 and a gate driver 26 for driving the liquid crystal panel 28, a backlight driver 30 for driving the backlight unit 50, a timing controller 20 for controlling drive of a panel driver 22 and the backlight driver 30, and a host set connected to the timing controller 20 and the backlight driver 30. Here, the backlight driver 30 may be internally installed in the timing controller 20.

The host set 10 scales image data input from an external source according to resolution of the liquid crystal panel 28 and supplies the image data to the timing controller 20 together with a plurality of synchronization signals. The plurality of synchronization signals include at least a dot clock and a data enable signal and further include a horizontal synchronization signal and a vertical synchronization signal. In addition, the host set 10 supplies a pulse width modulation (PWM) signal having a duty ratio that is preset according to a design value or is set according to user brightness adjustment to the backlight driver 30 or to the backlight driver 30 through the timing controller 20.

The timing controller 20 corrects data input from the host set 10 using various data processing methods for increasing image quality and reducing power consumption to output the data to the data driver 24 of the panel driver 22. For example, in order to increase a response speed of liquid crystal, the timing controller 20 may apply an overshoot or undershoot value selected from a lookup table according to a data difference between adjacent frames and may correct the input data into overdriving data to output the overdriving data. In addition, in order to increase a contrast ratio or to reduce power consumption, the timing controller 20 may analyze brightness of the input data, may control brightness of the backlight unit 50 according to the brightness analysis result, and may also correct and output the data. When the timing controller 20 controls the brightness of the backlight unit 50, the timing controller 20 may repeat the PWM signal from the host set 10 or may reflect a dimming value based on the brightness analysis result to adjust a duty ratio of the input PWM signal, and may supply the PWM signal, the duty ratio of which is adjusted, to the backlight unit 50.

In addition, the timing controller 20 generates a data control signal for control of drive timing of the data driver 24 and a gate control signal for control of drive timing of the gate driver 26 using the plurality of synchronization signals input from the host set 10. When the synchronization signal from the host set 10 includes a dot signal and a data enable signal, the timing controller 20 may generate and use a horizontal synchronization signal and a vertical synchronization signal (hereinafter, referred to as Vsync) via frequency analysis of the input data using the dot clock and the data enable signal. The timing controller 20 supplies the data control signal and the gate control signal to the data driver 24 and the gate driver 26, respectively. The data control signal includes a source start pulse and source sampling clock for controlling latch of a data signal, a polarity control signal for controlling polarity of the data signal, a source output enable signal for controlling an output period of the data signal, and the like. The gate control signal includes a gate start pulse and gate shift clock for control of scanning of a gate signal, a gate output enable signal for control of an output period of the gate signal, and the like. In addition, the timing controller 20 supplies the vertical synchronization signal (Vsync) to the backlight driver 30 for synchronization of the liquid crystal panel 28 and the backlight unit 50.

The panel driver 22 includes the data driver 24 for driving a data line DL formed on a thin film transistor (TFT) array of the liquid crystal panel 28, and the gate driver 26 for driving a gate line GL formed on the TFT array of the liquid crystal panel 28.

The data driver 24 supplies the image data from the timing controller 20 to a plurality of data lines DL of the liquid crystal panel 28 in response to the data control signal from the timing controller 20. The data driver 24 converts digital data input from the timing controller 20 into a positive/negative analog data signal using a gamma voltage and supplies the data signal to the data line DL whenever each gate line GL is driven. The data driver 24 may include at least one data IC, may be mounted on a circuit film such as a tape carrier package (TCP), a chip on film (COF), a flexible printed circuit (FPC), or the like, and may be attached to the liquid crystal panel 28 using a tape automatic bonding (TAB) method or may be mounted on the liquid crystal panel 28 using a chip on glass (COG) method.

The gate driver 26 sequentially drives gate lines GLs of the liquid crystal panel 28 in response to the gate control signal from the timing controller 20. The gate driver 26 supplies a scan pulse of a gate-on voltage to each gate line GL every corresponding scan period and supplies a gate-off voltage for the remaining period when the other gate lines GLs are driven. The gate driver 26 may include at least one gate IC, may be mounted on a circuit film such as a TCP, a COF, a FPC, or the like, and may be attached to the liquid crystal panel 28 using a TAB method or may be mounted on the liquid crystal panel 28 using a COG method. On the other hand, the gate driver 26 may be formed on a TFT substrate together with the TFT array using the same process and may be internally installed in the liquid crystal panel 28 using a gate in panel (GIP) method.

The liquid crystal panel 28 includes a color filter substrate on which a color filter array is formed, a thin film transistor (TFT) substrate on which a TFT array is formed, a liquid crystal layer between the color filter substrate and the TFT substrate, and polarizing plates attached to external surfaces of the color filter substrate and TFT substrate. The liquid crystal panel 28 displays an image through a pixel matrix on which a plurality of pixels is arranged. Each pixel implements desired color by combinations of red R, green G, and blue B sub-pixels which adjust optical transmittance using variation in liquid crystal arrangement according to a data signal. Each sub-pixel includes a thin film transistor TFT connected to the gate line GL and the data line DL, and a liquid crystal capacitor Clc and a storage capacitor Cst that are connected in parallel to the thin film transistor TFT. The liquid crystal capacitor Clc is charged with a difference voltage between the data signal applied to a pixel electrode through the thin film transistor TFT and a common voltage Vcom applied to a common electrode, and drives liquid crystal according to the charged voltage to adjust optical transmittance. The storage capacitor Cst stably maintains the voltage charged in the liquid crystal capacitor Clc. The liquid crystal layer is driven by a vertical magnetic field, for example, in a twisted nematic (TN) mode or a vertical alignment (VA) mode or by a horizontal magnetic field, for example, in an in-plane switching (IPS) mode or a fringe field switching (FFS) mode.

The backlight unit 50 may use a direct type or edge type backlight including, as a light source, a fluorescent lamp driven by the backlight driver 30, such as a cold cathode fluorescent lamp (CCFL), an external electrode fluorescent lamp (EEFL), or the like, or a light emitting diode (LED). The direct type backlight includes light sources that are arranged over an entire display region so as to face a bottom surface of the liquid crystal panel 28 and a plurality of optical sheets arranged over the light sources, and is configured in such a way that light emitted from the light sources is irradiated to the liquid crystal panel 28 through the plurality of optical sheets. The edge type backlight includes a light guide plate facing the bottom surface of the liquid crystal panel 28, a light source disposed to face at least one edge of the light guide plate, and a plurality of optical sheets disposed on the light guide plate, and is configured in such a way that light emitted from the light source is converted into light of a surface light source and is irradiated to the liquid crystal panel 28 through the plurality of optical sheets.

The backlight driver 30 drives the backlight unit 50 and also controls brightness of the backlight unit 50 in response to a duty ratio of the PWM signal input from the host set 10 or the timing controller 20. When the backlight unit 50 is divided into a plurality of regions and is driven, a plurality of backlight drivers 30 may be used to independently drive the plurality of regions.

The backlight driver 30 samples the PWM signal input from the host set 10 or the timing controller 20 to detect a duty ratio of the PWM signal. The backlight driver 30 generates an output PWM signal using the Vsync and the detected duty ratio and drives the backlight unit 50 using the generated output PWM signal.

When the backlight driver 30 filters an input duty ratio detected from an input PWM signal, if the input duty ratio is detected to exceed a preset reference (or a reference range), that is, if the input duty ratio is detected to correspond to an unstable case, the backlight driver 30 may exclude the unstable input duty ratio and may select and output a stable input duty ratio of a previous period, thereby removing the unstable duty ratio.

The backlight driver 30 may select only the stable duty ratio by filtering the input duty ratio even if the input PWM signal is unstable, and an output PWM signal having a stable duty ratio is generated such that the backlight unit 50 may be driven, thereby preventing backlight flicker caused by an unstable input PWM signal. Therefore, although the input PWM signal is unable, the backlight driver 30 selects only a stable duty ratio through filtering of the input duty ratio, generates an output PWM signal having a stable duty ratio, and may drive the backlight unit 50 using the generated PWM signal, resulting in prevention of backlight flicker caused by an unstable input PWM signal.

Figure 3:
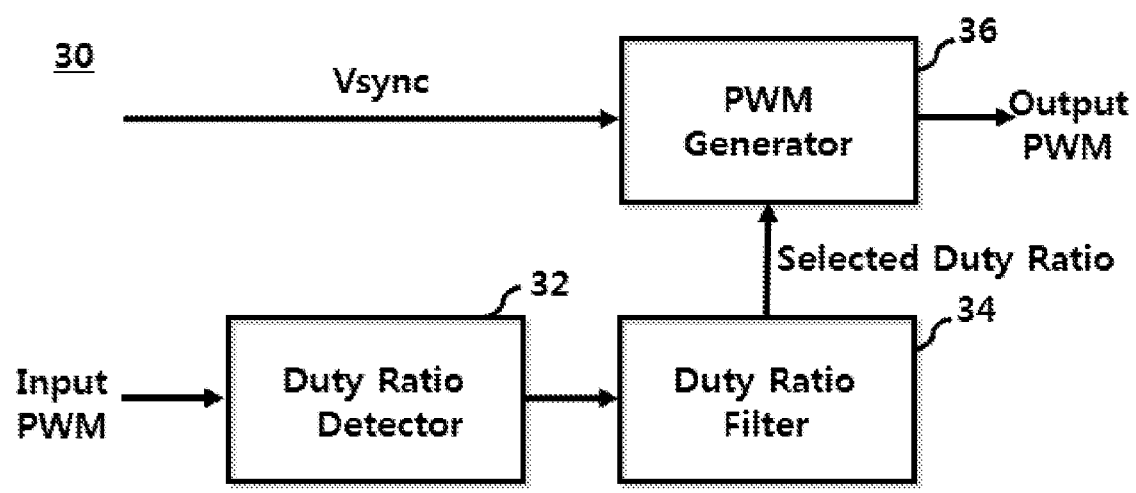
FIG. 3 is a block diagram of an internal structure of the backlight driver shown in FIG. 2.

FIG. 3 is a block diagram of an internal structure of the backlight driver 30 shown in FIG. 2. The backlight driver 30 shown in FIG. 3 includes a duty ratio detector 32 for sampling and counting an input PWM signal to detect an input duty ratio; a duty ratio filter 34 for selecting/outputting a stable duty ratio by filtering an input duty ratio of the duty ratio detector 32; and a PWM generator 36 for generating an output PWM signal obtained when the duty ratio selected from the duty ratio filter 34 is reflected in the input vertical synchronization signal, and outputting the generated PWM signal to the backlight unit 50.

The duty ratio detector 32 samples the PWM signal input from the host set 10 or the timing controller 20 to detect the input duty ratio. The duty ratio detector 32 detects each period (P) of the input PWM signal and also detects a high pulse width (A) of each period (P) by sampling and counting the input PWM signal using an internal clock. In addition, the duty ratio detector 32 calculates a ratio of the high pulse width (A) to the period (P) detected per period as a percentage to detect and output the input duty ratio every period of the input PWM signal.

The duty ratio filter 34 eliminates an unstable duty ratio by filtering an input duty ratio from the duty ratio detector 32, selecting a stable duty ratio, and outputting the selected duty ratio. In more detail, as exemplarily shown in FIG. 4, the duty ratio filter 34 calculates a difference between a previous duty ratio and a current duty ratio for each frame, and compares a difference between the calculated adjacent duty ratios with a preset reference value. If a difference between the duty ratios exceeds the reference value, the duty ratio filter 34 determines a current duty ratio to be an unstable duty ratio, selects a previous stable duty ratio instead of the current unstable duty ratio, and outputs the selected duty ratio as a current duty ratio. In addition, the duty ratio filter feeds back the selected duty ratio, and uses the duty ratio as a previous duty ratio compared with a current duty ratio from the duty ratio detector 32 in the next frame. Therefore, the duty ratio filter 34 may exclude the unstable duty ratio, select the stable duty ratio, and output the selected duty ratio. A reference value of the input duty ratio may be obtained by presetting an appropriate range to a corresponding liquid crystal display device through a plurality of experiments by a designer and storing the appropriate range in an internal memory of the liquid crystal display device, and may be updated as necessary.

The PWM generator 36 reflects the duty ratio selected from the duty ratio filter 34 into the vertical synchronization signal (Vsync) from the timing controller 20, such that it generates a Vsync period and an output PWM signal having the selected duty ratio, and outputs them to the backlight unit 50. For example, the PWM generator 36 detects the Vsync period, generates an internal clock based on the detected Vsync period, generates the PWM signal having the selected duty ratio using the internal clock, and outputs the PWM signal to the backlight unit 50.

The Vsync filter may be further connected to an input stage of the PWM generator 36. The Vsync filter excludes an unstable vertical synchronization signal (Vsync) exceeding a reference range by filtering the vertical synchronization signal (Vsync) from the timing controller 20, and supplies a stable vertical synchronization signal (Vsync) contained in the reference range to the PWM generator 36.

Figure 4:
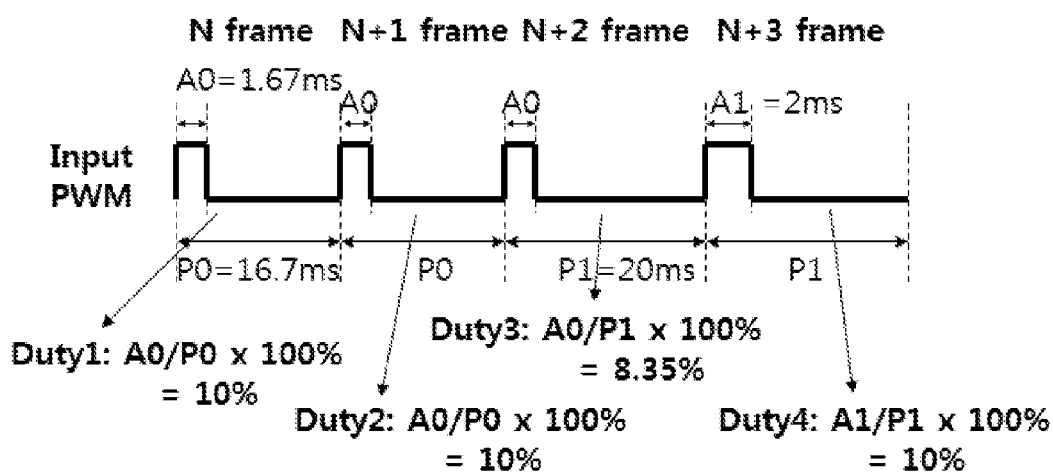
FIG. 4 exemplarily shows a method for filtering a duty ratio of a backlight driver shown in FIG. 3.

FIG. 4 exemplarily shows a method for filtering a duty ratio of a backlight driver shown in FIG. 3. Referring to FIG. 4, when a frequency of an input PWM signal is changed from 60 Hz to 50 Hz in response to change of the frame frequency, there occurs a specific period in which the duty ratio of the input PWM signal drops from 10% to 8.35% and then returns to 10%. For example, if a reference value of the duty ratio filter 34 is set to 1.5% and a difference in duty ratio is higher than the reference value, this means that a current input duty ratio is unstable.

In the N+1 frame, since there is no difference between a previous duty ratio of 10% and a current duty ratio of 10%, the current duty ratio of 10% is considered stable so that the current duty ratio of 10% is selected and output. The selected duty ratio of 10% is fed back and is used as a previous duty ratio in the next N+2 frame.

In the N+2 frame, since a difference 1.65% between a previous duty ratio 10% and a current duty ratio 8.35% is higher than a reference value 1.5%, the current input duty ratio of 8.35% is considered unstable so that the 8.35% duty ratio is excluded. As a result, the previous duty ratio of 10% is selected and output, and the selected duty ratio of 10% is fed back and is used as a previous duty ratio in the next (N+3) frame.

In the N+3 frame, since there is no difference between a previous duty ratio of 10% and a current duty ratio of 10%, the current duty ratio of 10% is considered stable so that the current duty ratio of 10% is selected and output. The selected duty ratio of 10% is fed back and is used as a previous duty ratio in the next frame.

Therefore, although there occurs an abnormal period in which the duty ratio of an input PWM signal becomes unstable in the frequency change process, the duty ratio filter 34 selects/outputs a stable previous duty ratio instead of a current unstable duty ratio, thereby excluding the unstable duty ratio.

Figure 5:
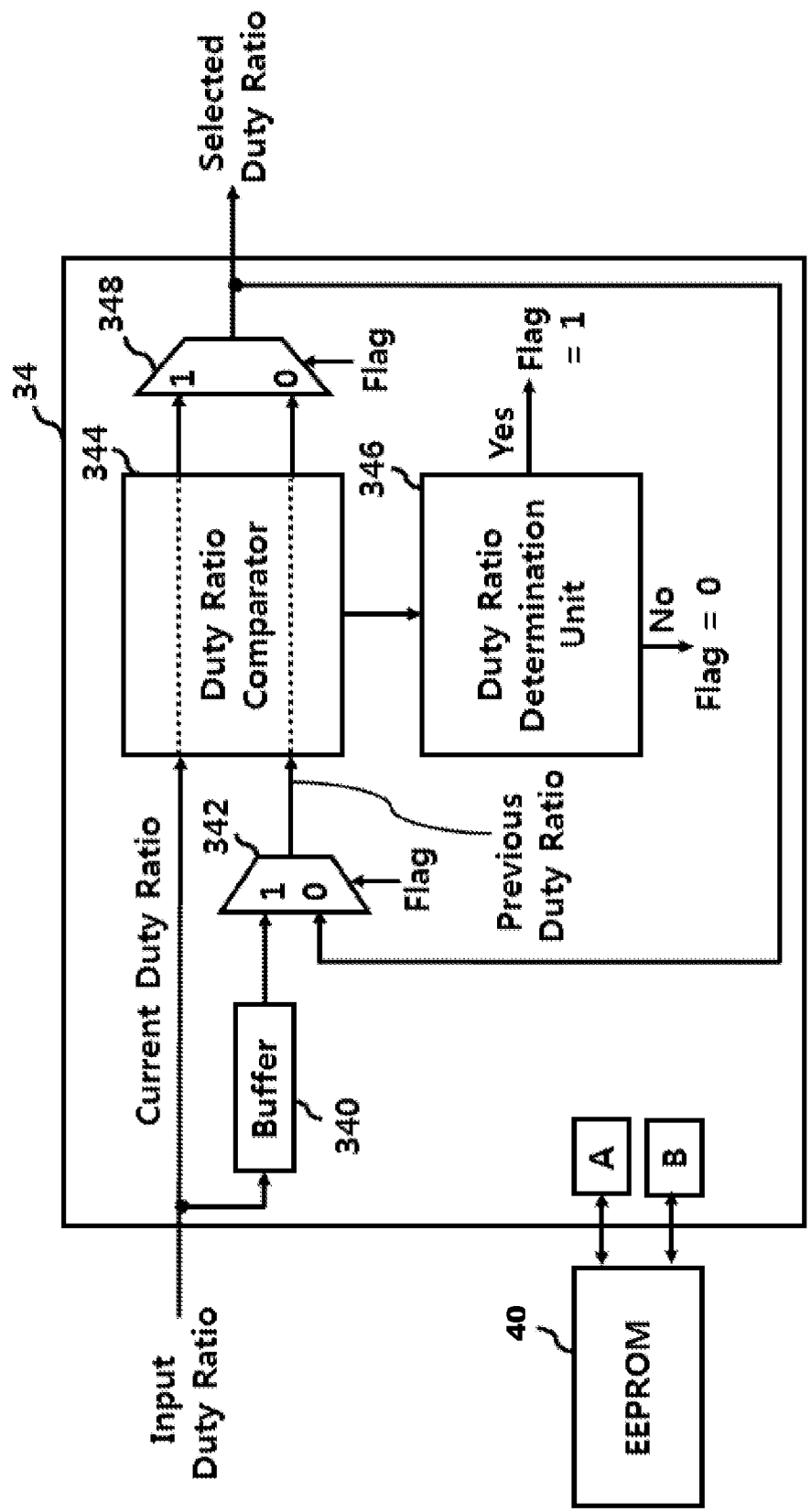
FIG. 5 is a schematic block diagram of the duty ratio filter shown in FIG. 3 according to another embodiment of the present invention.

FIG. 5 is a schematic block diagram of the duty ratio filter 34 shown in FIG. 3 according to another embodiment of the present invention. Referring to FIG. 5, the duty ratio filter 34 includes a buffer 340 for delaying an input duty ratio from the duty ratio detector 32 shown in FIG. 32 by one frame; an input multiplexer 342 for selecting one of a duty ratio from the buffer 340 and a fed back duty ratio in response to a flag signal, and outputting the selected duty ratio as a previous duty ratio; a duty ratio comparator 344 for comparing a previous duty ratio from the input multiplexer 342 with a current duty ratio from the duty ratio detector 32 so as to detect a difference in duty ratio; a duty ratio determination unit 346 for comparing the duty-ratio difference from the duty ratio comparator 344 with a preset reference value (or a reference range) so as to output a flag signal indicating whether the current duty ratio is stable; and a multiplexer 348 for selecting one of a previous duty ratio from the duty ratio comparator 344 and a current duty ratio in response to a flag signal from the duty ratio determination unit 346, and outputting the selected duty ratio.

The buffer 340 delays the input duty ratio from the duty ratio detector 32 shown in FIG. 3 by one frame, and outputs the delayed result to the input multiplexer 342.

Upon receiving the flag signal from the duty ratio determination unit 346, the input multiplexer 342 selects one of a previous input duty ratio from the buffer 340 and another duty ratio fed back from the output stage of the output multiplexer 348 as a previous duty ratio, and outputs the selected duty ratio to the duty ratio comparator 344. If the flag signal from the duty ratio determination unit 346 indicates a stable state of the current duty ratio, the input multiplexer 342 selects a previous input duty ratio from the buffer 340 as a previous duty ratio, and outputs the selected duty ratio to the duty ratio comparator 344. On the other hand, if the flag signal from the duty ratio determination unit 346 indicates an unstable state of the current duty ratio, the input multiplexer 342 selects the duty ratio fed back from the output stage of the output multiplexer 348 as a previous duty ratio, and outputs the selected duty ratio to the comparator 344.

The duty ratio comparator 344 compares a previous duty ratio from the input multiplexer 342 with a current duty ratio from the duty ratio detector 32 so as to detect a difference in duty ratio, outputs the detected duty-ratio difference to the duty ratio determination unit 346, and outputs the previous duty ratio and the current duty ratio to the output multiplexer 348.

The duty ratio determination unit 346 compares the duty-ratio difference from the duty ratio comparator 344 with a preset reference value (or a reference range), and generates/outputs a flag signal indicating whether the current duty ratio is stable. In more detail, the duty ratio determination unit 346 compares the duty-ratio difference from the duty ratio comparator 344 with a preset minimum reference value A and a preset maximum reference value B. If the duty ratio difference is less than the minimum reference value A or is higher than the maximum reference value B, the current duty ratio is determined to be stable, and the flag signal "1" indicating the stable state is output to the first and output multiplexers 342 and 348. On the other hand, assuming that the duty ratio difference is equal to or higher than the minimum reference value A or is equal to or less than the maximum reference value B, the duty ratio determination unit 346 determines that the current duty ratio is unstable. The flag signal "0" indicating the unstable state is output to the first and output multiplexers 342 and 348.

In contrast, if the duty ratio difference is equal to or higher than the minimum reference value A or is equal to or less than the maximum reference value B, the duty ratio determination unit 346 may determine that the current duty ratio is stable. If the duty ratio difference is less than the minimum reference value A or higher than the maximum reference value B, the duty ratio determination unit 346 may determine that the current duty ratio is unstable.

The minimum and maximum reference values A and B serving as threshold values of the duty ratio determination unit 346 are preset according to a corresponding liquid crystal display device by a designer and are pre-stored in an EEPROM 40 that is an internal memory of the liquid crystal display device. The host set 10 may update the minimum and maximum reference values A and B stored in the EEPROM 40 to a user-desired value, that is, an intended value of the host set 10 via I2C communication, thereby increasing a freedom degree of adjustment of the reference values A and B. As a result, variation of the duty ratio of a PWM signal intended by the host set 10 may be achieved.

The output multiplexer 348 selects one of a previous duty ratio from the duty ratio comparator 344 and a current duty ratio in response to a flag signal from the duty ratio determination unit 346, and outputs the selected duty ratio to the PWM generator 36 and the input multiplexer 342. If the flag signal from the duty ratio determination unit 346 indicates a stable state of the current duty ratio, the output multiplexer 348 selects a current duty ratio from the duty ratio comparator 344, and outputs the selected duty ratio to the PWM generator 36 and the input multiplexer 342. On the other hand, if the flag signal from the duty ratio determination unit 346 indicates an unstable state of the current duty ratio, the output multiplexer 348 selects a previous duty ratio from the duty ratio comparator 344, and outputs the selected duty ratio to the PWM generator 36 and the input multiplexer 342.

In one embodiment, the buffer 340 and the input multiplexer 342 may be omitted from the duty ratio filter 34 illustrated in FIG. 5. In this case, the duty ratio comparator 344 may use the selected duty ratio fed back from the output stage from the output multiplexer 348 as a previous duty ratio.

Figure 6:
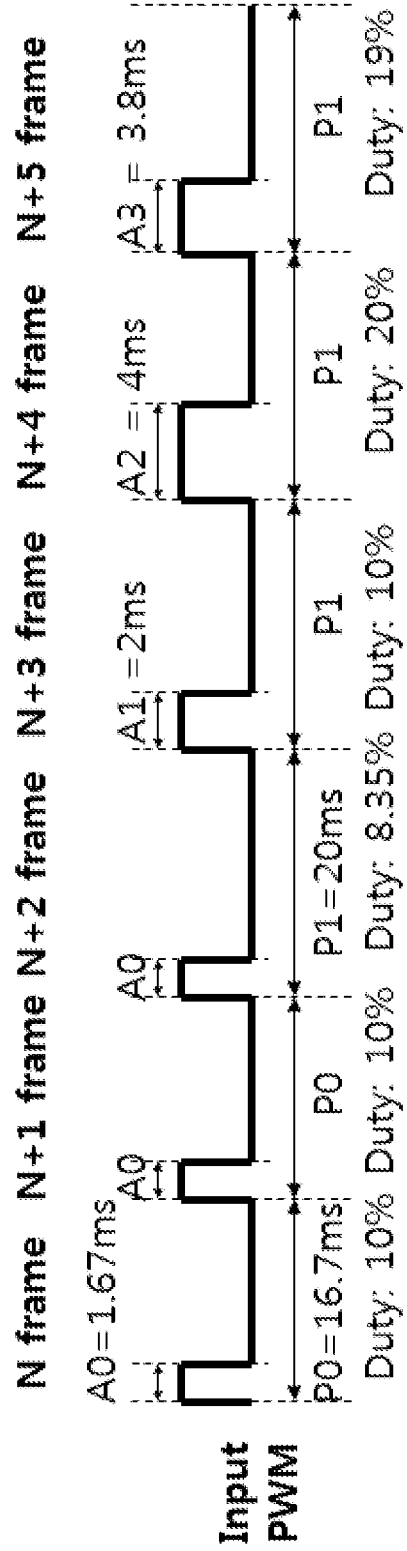
FIG. 6 exemplarily shows a method for filtering a duty ratio of a duty ratio filter shown in FIG. 5.

FIG. 6 exemplarily shows the duty-ratio filtering method for use in the duty ratio filter 34 shown in FIG. 5. Referring to FIG. 6, when a frequency of an input PWM signal is changed from 60 Hz to 50 Hz in response to change of the frame frequency, there occurs a specific period in which the duty ratio of the input PWM signal drops from 10% to 8.35% and then returns to 10%. As illustrated in FIG. 6, the duty ratio of the input PWM signal is changed from 10% to 20%, or is changed from 20% to 19%. For example, if a minimum reference value A of the duty ratio filter 346 is set to 1.5% and a maximum reference value B thereof is set to 8.5%, and if a difference in duty ratio is less than the minimum reference value A or is higher than the maximum reference value B, this means that a current input duty ratio is stable.

In the N+1 frame, since there is no difference between a previous duty ratio of 10% and a current duty ratio of 10%, the current duty ratio of 10% is considered stable. In response to the flag signal "1" indicating the stable state, the current duty ratio of 10% is selected and output.

In the N+2 frame, in response to the flag signal "1" indicating the stable state in the N+1 frame, the 10% duty ratio delayed by one frame is selected as a previous duty ratio. Since a difference 1.65% between a previous duty ratio 10% and a current duty ratio 8.35% is higher than a minimum reference value (A) 1.5%, the current input duty ratio of 8.35% is considered unstable, so that the current duty ratio of 8.35% is considered unstable. As a result, the previous duty ratio of 10% is selected and output in response to the flag signal "0" indicating the unstable state.

In the N+3 frame, in response to the flag signal "0" indicating the unstable state in the N+2 frame, the 10% fed back duty ratio is selected as a previous duty ratio. Since there is no difference between a previous duty ratio of 10% and a current duty ratio of 10%, the current duty ratio of 10% is considered stable so that the current duty ratio of 10% is selected and output in response to the flag signal (1) indicating the stable state.

In the N+4 frame, in response to the flag signal "1" indicating the stable state in the N+3 frame, the 10% duty ratio delayed by one frame is selected as a previous duty ratio. Since a difference 10% between a previous duty ratio 10% and a current duty ratio 20% is higher than a maximum reference value (B) 8.5%, the current duty ratio of 20% is considered stable. As a result, the current duty ratio of 20% is selected and output in response to the flag signal "1" indicating the stable state.

In the N+5 frame, in response to the flag signal "1" indicating the stable state in the N+4 frame, the 20% duty ratio delayed by one frame is selected as a previous duty ratio. Since a difference 1% between a previous duty ratio 20% and a current duty ratio 19% is less than a minimum reference value (A) 1.5%, the current duty ratio of 19% is considered stable. As a result, the current duty ratio of 19% is selected and output in response to the flag signal "1" indicating the stable state.

Therefore, although there occurs an abnormal period in which the duty ratio of an input PWM signal becomes unstable in the frequency change process, the duty ratio filter 34 selects/outputs a stable previous duty ratio instead of a current unstable duty ratio, thereby excluding the unstable duty ratio.

As described above, the backlight driver and the method for driving the same according to the present invention compare a previous duty ratio with a current duty ratio every period of an input PWM signal. If a current duty ratio is unstable, the backlight driver and the method for driving the same may select and output a stable duty ratio, may generate an output PWM signal having a stable duty ratio even if an input PWM signal is unstable, and may drive the backlight unit 50 using the generated PWM signal, resulting in prevention of backlight flicker caused by an unstable input PWM signal.

As is apparent from the above description, a backlight driver and a method for driving the same according to the embodiments of the present invention remove an unstable duty ratio by filtering an input PWM signal, maintain a stable duty ratio, and generate a stable output PWM signal irrespective of an unstable input PWM signal input, thereby preventing backlight flicker by controlling a backlight unit.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A backlight driver comprising:
   a duty ratio detector for detecting a duty ratio of an input pulse width modulation (PWM) signal;
   a buffer for delaying a current duty ratio from the duty ratio detector by one frame, and outputting the delayed duty ratio as a previous duty ratio;
   a duty ratio filter for detecting a difference between the current duty ratio received from the duty ratio detector and the previous duty ratio received from the buffer, the duty ratio filter comprising:
      a duty ratio comparator for comparing the previous duty ratio with a current duty ratio to detect the duty ratio difference;
      a duty ratio determination circuit for comparing the duty ratio difference from the duty ratio comparator with a reference condition and outputting a flag signal indicating whether the reference condition is satisfied; and
      an output multiplexer for selecting one of the previous duty ratio from the duty ratio comparator and the current duty ratio in response to the flag signal from the duty ratio determination circuit and outputting the selected duty ratio;
   an input multiplexer for selecting one of the delayed duty ratio from the buffer and the selected duty ratio from the output multiplexer in response to a flag signal from the duty ratio determination signal, and outputting the selected duty ratio as the previous duty ratio for a next cycle of the input PWM signal; and
   a PWM generator for generating an output PWM signal obtained when a selected duty ratio from the duty ratio filter is reflected in an input synchronization signal, and outputting the output PWM signal to a backlight unit.

2. The backlight driver according to claim 1, wherein:
   if the duty ratio difference is less than a preset minimum reference value or is higher than a preset maximum reference value, the duty ratio determination circuit determines that the current duty ratio is stable; and
   if the duty ratio difference is equal to or higher than the minimum reference value or is equal to or less than the maximum reference value, the duty ratio determination circuit determines that the current duty ratio is unstable.

3. The backlight driver according to claim 1, wherein:
   if the duty ratio difference is between a minimum reference value and a maximum reference value, the duty ratio determination circuit determines that the current duty ratio is stable; and
   if the duty ratio difference is not between the minimum reference value and the maximum reference value, the duty ratio determination circuit determines that the current duty ratio is unstable.

4. The backlight driver according to claim 1, wherein the input PWM signal is a PWM signal received from a host set or a timing controller, and the input synchronization signal is a vertical synchronization signal received from the timing controller.

5. A method comprising:
   detecting by a duty ratio detector, a current duty ratio of an input pulse width modulation (PWM) signal;
   receiving a previous duty ratio of the input PWM signal;
   delaying, by a buffer, the current duty ratio by one frame;
   outputting the delayed duty ratio to an input multiplexer;
   comparing, by a duty ratio comparator, the received previous duty ratio to the current duty ratio to detect a duty ratio difference;
   comparing, by a duty ratio determination circuit, the duty ratio difference to a reference condition;
   outputting a flag signal indicating whether the reference condition is satisfied;
   selecting, by an output multiplexer, one of the received previous duty ratio and the current duty ratio in response to the flag signal;
   outputting the selected duty ratio from the output multiplexer;
   generating an output PWM signal by a PWM generator, the output PWM signal obtained when a selected duty ratio from a duty ratio filter is reflected in an input synchronization signal;
   outputting the output PWM signal from the PWM generator to a backlight unit;
   feeding back the selected duty ratio to the input multiplexer;

selecting by the input multiplexer, one of the delayed duty ratio and the fed back duty ratio in response to the flag signal; and outputting the selected duty ratio as a previous duty ratio for a next cycle of the input PWM signal.

6. The method according to claim 5, wherein outputting the flag signal includes:

if the duty ratio difference is less than a preset minimum reference value or is higher than a preset maximum reference value, determining that the current duty ratio is stable; and if the duty ratio difference is equal to or higher than the minimum reference value or is equal to or less than the maximum reference value, determining that the current duty ratio is unstable.

7. The method according to claim 5, wherein:

if the duty ratio difference is between a minimum reference value and a maximum reference value, determining that the current duty ratio is stable; and if the duty ratio difference is not between the minimum reference value and the maximum reference value, determining that the current duty ratio is unstable.

* * * * *